(12) United States Patent
Trimberger et al.

(10) Patent No.: US 7,268,581 B1
(45) Date of Patent: Sep. 11, 2007

(54) FPGA WITH TIME-MULTIPLEXED INTERCONNECT

(75) Inventors: Stephen M. Trimberger, San Jose, CA (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 140 days.

(21) Appl. No.: 11/111,229

(22) Filed: Apr. 21, 2005

(51) Int. Cl.
*G06F 7/38* (2006.01)
*H03K 19/173* (2006.01)

(52) U.S. Cl. .............................. 326/38; 326/41; 326/47

(58) Field of Classification Search ............. 326/37–47
See application file for complete search history.

(56) References Cited

U.S. PATENT DOCUMENTS

| | | | |
|---|---|---|---|
| 5,498,975 A * | 3/1996 | Cliff et al. .................... 326/10 |
| 5,581,199 A | 12/1996 | Pierce et al. | |
| 5,682,107 A * | 10/1997 | Tavana et al. ................. 326/41 |
| 6,084,429 A * | 7/2000 | Trimberger ................... 326/41 |
| 6,829,756 B1 | 12/2004 | Trimberger | |
| 7,012,448 B2 * | 3/2006 | Parkes .......................... 326/41 |

\* cited by examiner

*Primary Examiner*—James Cho
*Assistant Examiner*—Jason Crawford
(74) *Attorney, Agent, or Firm*—Walter D. Fields; William L. Paradice, III, Esq.

(57) ABSTRACT

A programmable logic device (PLD) includes a plurality of configurable resources, a programmable interconnect having a plurality of signal lines for providing a number of dedicated signal paths between any of the configurable resources, and a subway routing system having a shared subway bus coupled to the signal lines of the programmable interconnect at a plurality of connection points by a plurality of corresponding subway ports. The subway routing system, which provides alternate routing resources for the programmable interconnect, may be used to route different signals between different configurable resources at different times.

19 Claims, 7 Drawing Sheets

FPGA WITH TIME-MULTIPLEXED INTERCONNECT

FIELD OF INVENTION

This invention relates generally to signal routing resources in a programmable logic device (PLD), and in particular to a PLD having a programmable interconnect and having a separate subway routing system that may be used to bypass corresponding portions of the programmable interconnect.

DESCRIPTION OF RELATED ART

A programmable logic device (PLD) is a well-known general-purpose device that can be programmed by a user to implement a variety of selected functions. PLDs are becoming increasingly popular with circuit designers because they are less expensive, more flexible, and require less time to implement than custom-designed integrated circuits such as Application Specific Integrated Circuits (ASICs).

There are many types of PLDs such as Field Programmable Gate Arrays (FPGAs) and complex PLDs (CPLDs). For example, an FPGA typically includes an array of configurable logic blocks (CLBs) surrounded by a plurality of input/output blocks (IOBs). The CLBs are individually programmable and can be configured to perform a variety of logic functions including, for example, logic in lookup tables (LUTs) and storage in flip-flops or latches. The IOBs are selectively connected to various I/O pins of the FPGA, and can be configured as either input buffers or output buffers. The FPGA may also include tri-state buffers that users may use to share routing wires. The FPGA has a configurable routing structure called a programmable interconnect for interconnecting the CLBs and IOBs according to the desired user circuit design. The FPGA also includes a number of configuration memory cells that control the logic functions implemented by the CLBs and that designate specific signal routing paths in the programmable interconnect to selectively interconnect the various CLBs and IOBs.

The functionality of an FPGA may be increased by increasing the number of CLBs and the number of signal lines in the programmable interconnect. However, for any given semiconductor fabrication technology, there are limitations to the size of the programmable interconnect and to the number of CLBs that can be fabricated on an integrated circuit chip of practical size. Thus, there is a continuing desire to implement more CLBs and more complex programmable interconnects in less circuit area. More specifically, because the chip area of a PLD is typically dominated by its programmable interconnect, prior techniques have been proposed to increase the routing capabilities of the programmable interconnect. For example, U.S. Pat. No. 6,829,754 to Trimberger, which is incorporated herein by reference, discloses a technique for time multiplexing selected portions of a PLD's programmable interconnect so that data may be routed on shared portions of the programmable interconnect at different times to different destinations.

However, because a PLD's programmable interconnect is designed to accommodate the most time-critical signals of numerous possible user designs that may be implemented by the PLD, the programmable interconnect typically consumes a significant amount of silicon area of the PLD, and typically exhibits limited signal routing flexibility. Therefore, there is a need for a PLD routing structure that offers more flexibility and exhibits more routing efficiencies than those provided by prior PLD signal routing techniques.

SUMMARY

A method and apparatus are disclosed that provide a more flexible and more efficient signal routing structure suitable for use in a PLD. In accordance with an embodiment of the present invention, a PLD includes a plurality of configurable resources, a programmable interconnect, and a separate subway routing system. The programmable interconnect includes a plurality of signal lines that may provide dedicated signal paths between any of the configurable resources. The subway routing system includes a shared subway bus that is coupled to the programmable interconnect's signal lines at various interconnection points by a plurality of corresponding subway ports. The subway bus, which is configured to route data between different subway ports at different times, supplements the signal routing capability of the programmable interconnect. For example, data that is routed between various configurable resources of the PLD via the subway bus bypasses corresponding signal line portions of the programmable interconnect, thereby allowing the corresponding signal line portions of the programmable interconnect to provide dedicated signal paths between other configurable resources.

For some embodiments, the programmable interconnect may provide dedicated signal paths suitable routing for high performance signals, and the subway routing system may provide shared signal paths suitable for routing low performance signals. Accordingly, for such embodiments, the programmable interconnect may be used to route time critical signals across the PLD, and the subway routing system may be used to time multiplex non-time critical signals across the PLD, thereby relieving routing demands on the programmable interconnect, which in turn may allow for a reduction in size of the programmable interconnect without any performance degradation.

For example, a netlist embodying a user design may be analyzed for low performance signals. The nets associated with the low performance signals may be identified and grouped together to form a sub-netlist, which in turn is removed from the original netlist to form a modified netlist that includes various high performance signals suitable for routing over the PLD's programmable interconnect. The design embodied by the modified netlist may be mapped to the configurable resources of the PLD, and the high performance signals associated with the modified netlist may be routed using the PLD's programmable interconnect. Then, the low performance signals associated with the sub-netlist may be placed and routed on the subway routing system, which may use time-multiplexing techniques to route various low performance signals between different PLD resources at different times without any performance degradation. Accordingly, by using the programmable interconnect to provide dedicated signal paths for high performance signals and using the subway routing system to time-multiplex a plurality of low performance signals, embodiments of the present invention may provide a routing structure that provides more flexibility and exhibits superior efficiency than prior PLD routing techniques.

For some embodiments, data selected for routing over the subway routing system may be assigned corresponding time slots and transmitted between corresponding portions of the PLD without using destination addresses. For example, for each time slot, the subway ports associated with routing corresponding data over the subway bus may be enabled to transmit data to and receive data from the subway bus, and the subway ports not associated with the corresponding data may be disabled from transmitting data to and receiving data from the subway bus.

For other embodiments, data may be routed over the subway routing system using destination addresses, which in turn may avoid potential performance degradation or failure resulting from imprecise time slot synchronization between the various subway ports of the subway routing system. For example, each subway port may be programmed to attach a predetermined destination address for data received from a corresponding signal path of the programmable interconnect and programmed to receive data from the subway bus having designated destination addresses.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are described below with respect to an exemplary FPGA architecture that is generally representative of the Virtex-II Pro™ family of FPGA devices from Xilinx, Inc. for simplicity only. It is to be understood that embodiments of the present invention are equally applicable to other FPGA architectures and to other integrated circuits (ICs), including programmable logic devices such as complex PLDs. In the following description, for purposes of explanation, specific nomenclature is set forth to provide a thorough understanding of the present invention. In other instances, well-known circuits and devices are shown in block diagram form to avoid obscuring the present invention. Further, the logic levels assigned to various signals in the description below are arbitrary and, thus may be modified (e.g., reversed polarity) as desired. Accordingly, the present invention is not to be construed as limited to specific examples described herein but rather includes within its scope all embodiments defined by the appended claims.

Figure 1:
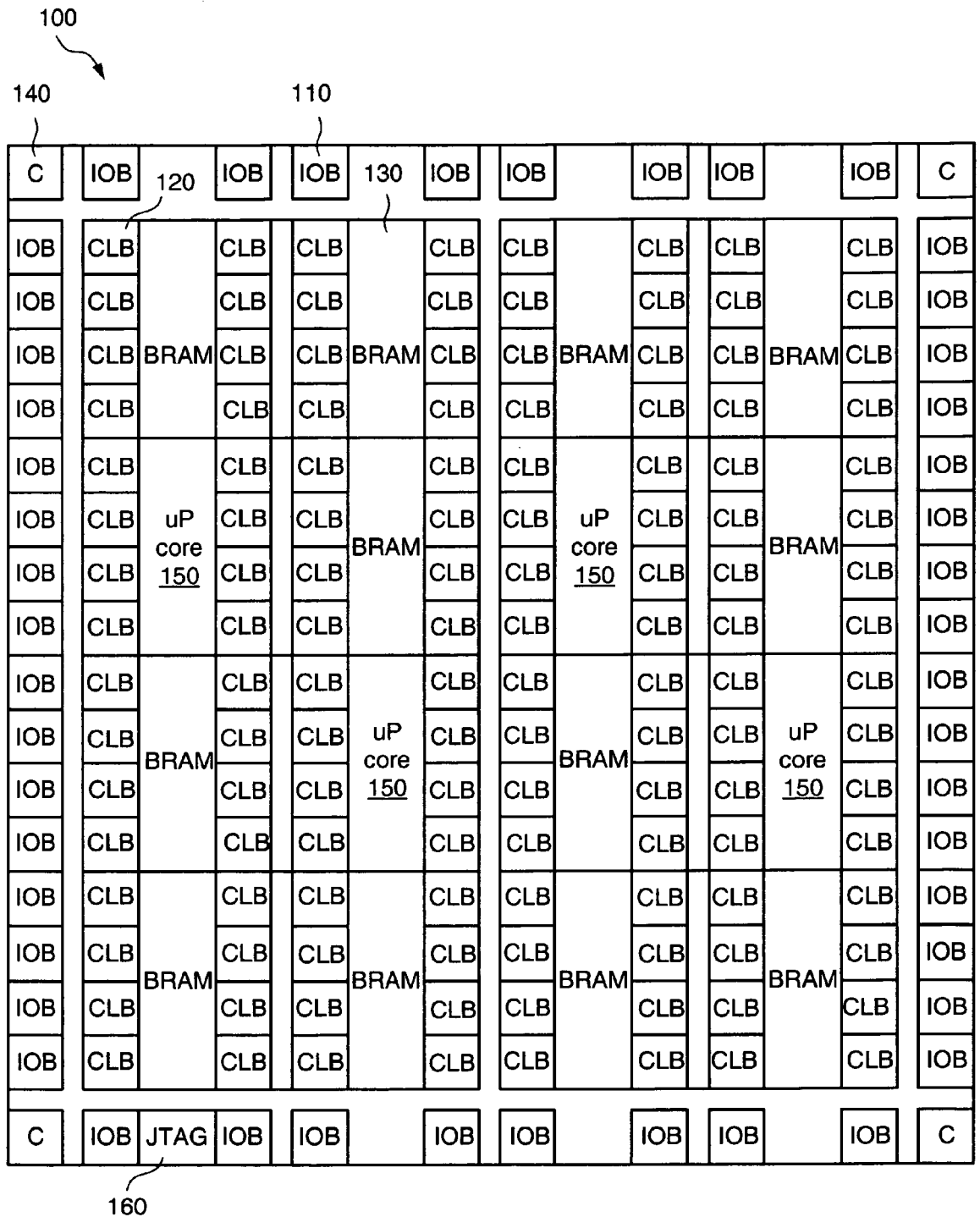
FIG. 1 is a block diagram illustrating the general layout of an FPGA within which embodiments of the present invention may be implemented.

FIG. 1 illustrates the general layout of an FPGA 100 that is generally representative and consistent with the Virtex-II Pro™ FPGA family of FPGA devices available from Xilinx, Inc. FPGA 100 is shown to include a plurality of IOBs 110, CLBs 120, block RAMs (BRAM) 130, corner blocks 140, processor (uP) cores 150, and JTAG test circuitry 160. IOBs 110 are well-known, and are located around the perimeter of FPGA 100. CLBs 120 are well-known, and may be arranged in columns in FPGA 100. BRAMs 130 are well-known, and may be arranged in columns between adjacent CLB columns. Corner blocks 140 are well-known, and may contain configuration circuitry and/or may be used to provide additional routing resources. Processor cores 150, which are well-known and are depicted in the exemplary embodiment of FIG. 1 as lying within corresponding BRAM columns, have direct access to adjoining BRAMs 130 and CLBs 110. A well-known programmable interconnect (not shown in FIG. 1 for simplicity) is provided to programmably connect the IOBs 110, CLBs 120, block RAMs 130, corner blocks 140, and processor cores 150. For some embodiments, the programmable interconnect also facilitates communication between processor cores 150 and external memory (not shown for simplicity) that stores information (e.g., data, instructions, and the like) for use by processor cores 150. JTAG test circuitry 160 is well-known, and may be used to configure FPGA 100 and to implement various testing operations for FPGA 100.

The IOBs 110, CLBs 120, block RAM 130, corner blocks 140, and the programmable interconnect each contain one or more configurable elements (not shown in FIG. 1 for simplicity) that configure FPGA 100 to implement a desired function in response to configuration data stored in associated configuration memory cells (not shown in FIG. 1 for simplicity). Other well-known components of FPGA 100 are not shown in FIG. 1 for simplicity.

Further, although a particular FPGA layout is illustrated in FIG. 1, it is to be understood that many other FPGA layouts are possible, and are considered to fall within the scope of the present invention. For example, other embodiments may have other numbers of IOBs 110, CLBs 120, block RAMs 130, and processor cores 150 provided in different arrangements, and/or may have other types of blocks. A more detailed description of the general operation of FPGA 100 is provided in "The Programmable Logic Databook 1998" pp. 4-1 to 4-40, which is available from Xilinx, Inc. of San Jose, Calif., and incorporated by reference herein.

Figure 2:
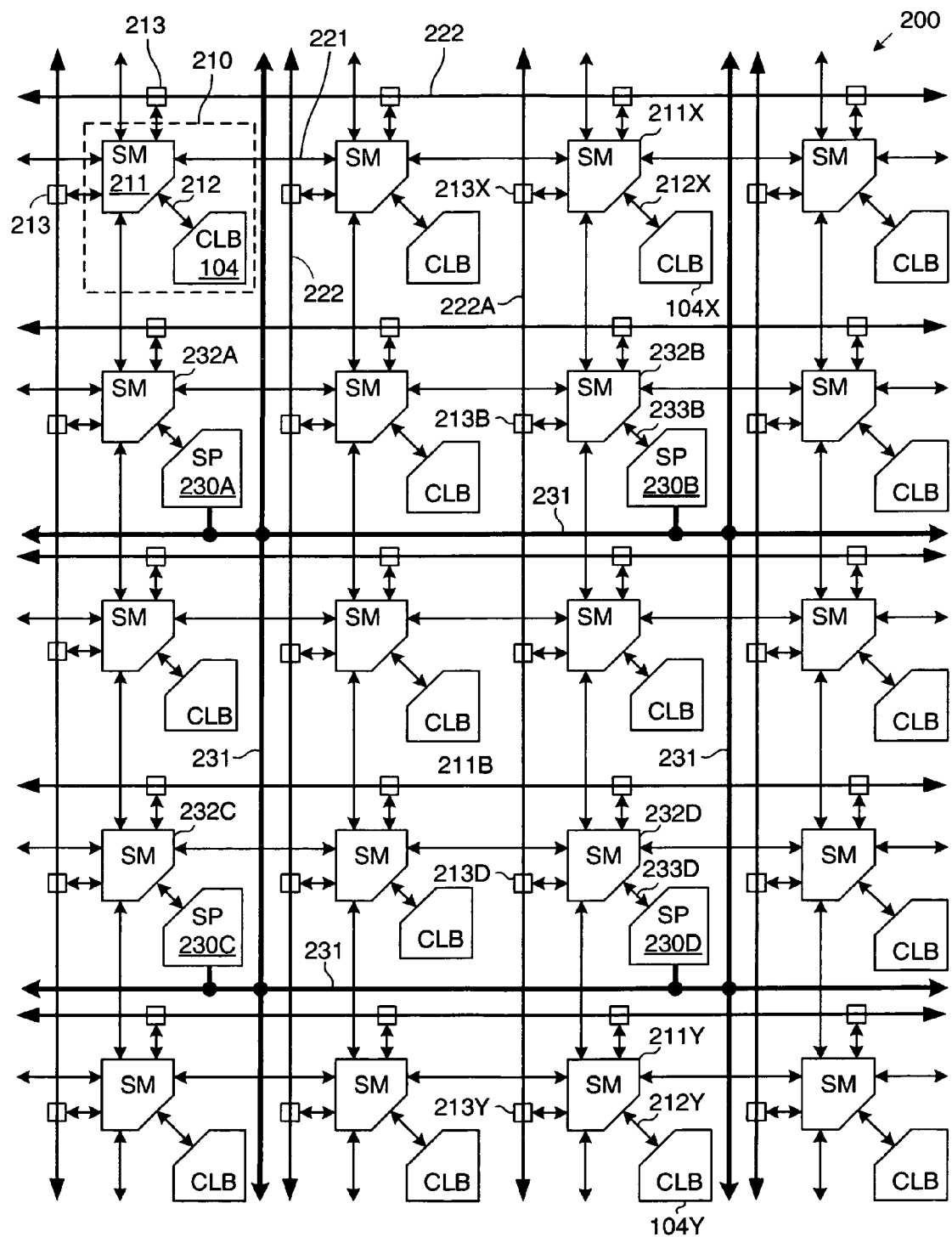
FIG. 2 is simplified block diagram depicting a portion of the FPGA of FIG. 1 including a subway routing system in accordance with some embodiments of the present invention.

FIG. 2 shows an exemplary portion 200 of FPGA 100 in more detail. FPGA portion 200 is shown to include an array of CLB tiles 210, each including a CLB 104, a switch matrix 211, and a plurality of signal lines 212 connected between corresponding I/O ports of CLB 104 and switch matrix 211. Switch matrix 211, which is well-known, is coupled to signal lines 222 via a corresponding programmable interconnect point (PIP) 213, which is well-known. For some embodiments, switch matrix 211 is of the type disclosed in U.S. Pat. No. 6,292,022 to Young et al., which is incorporated herein by reference, although other switch matrices may be used. Further, each switch matrix 211 may include a number of PIPs for coupling the switch matrix to a number of adjacent switch matrices via corresponding signal lines 221.

Signal lines 221, which extend across one CLB tile to connect switch matrices 211 in adjacent CLB tiles 210, are commonly known as single-length lines. Signal lines 222, which extend across multiple CLB tiles and may be used to route signals between non-adjacent CLB tiles, are representative of intermediate length lines (e.g., such as double-length lines, quad-length lines, hex-length lines, and so on) and long lines (e.g., such as global lines that extend across an entire row or column of the FPGA). Together, PIPs 213 and signal lines 221-222 form the programmable interconnect of FPGA portion 200. For simplicity, each of signal lines 212, 221, and 222 shown in FIG. 2 is representative of a plurality of single-bit and/or multi-bit signal lines.

As known in the art, the programmable interconnect provides dedicated circuit-switched connections between corresponding FPGA resources for each signal selected for routing over the programmable interconnect. For some embodiments, the programmable interconnect may be of the type disclosed in U.S. Pat. No. 5,469,003 to Kean, which is incorporated herein by reference. For other embodiments, the tile-based interconnect structure disclosed in U.S. Pat. No. 5,581,199 to Pierce, which is incorporated herein by reference, may be used. For still other embodiments, other suitable programmable interconnect circuitry may be used. Further, although not shown in FIG. 2 for simplicity, FPGA 200 may include direct signal lines connected between adjacent CLB tiles so that data may be exchanged between adjacent CLBs 104 without using the programmable interconnect.

In an embodiment of the present invention, FPGA 200 includes a subway routing system including a plurality of subway ports 230A-230D and a subway bus 231. Each of subway ports 230A-230D includes a first interface coupled to the programmable interconnect via a corresponding switch matrix 232A-232D, and includes a second interface coupled to subway bus 231. For purposes of discussion herein, switch matrices 232 are of the same architecture as switch matrices 211, although for actual embodiments switch matrices 232 may be different than switch matrices 211. For other embodiments, subway ports 230A-230D may be connected directly to the programmable interconnect, thereby eliminating the need for corresponding switch matrices 232A-232D. For still other embodiments, one or more of subway ports 230 may be connected directly to corresponding CLB tiles 210.

For simplicity, other configurable resources such as IOB tiles and corner blocks, as well as block RAM, embedded processor cores, JTAG circuitry, and other well-known FPGA elements, are not shown in FIG. 2. Thus, although described below as routing data between CLB tiles 210, for some embodiments, the subway routing system may be used to route data to and from other FPGA resources including, for example, IOBs, block RAM, embedded processor cores, JTAG circuitry, and so on.

As explained in detail below, the subway routing system of one embodiment of the present invention allows data to be transmitted across portions of the FPGA without using the programmable interconnect, thereby freeing corresponding portions of the programmable interconnect for other routing functions. As known in the art, the programmable interconnect achieves high performance by providing dedicated circuit-switched signal paths between various FPGA resources. Thus, for some embodiments, the programmable interconnect may be used to route high performance signals (e.g., time critical signals having minimal timing slack), and the subway routing system may be used to route low performance signals (e.g., non-time critical signals having greater timing slack than the time critical signals). In accordance with some embodiments of the present invention, signals routed over the subway routing system may be time multiplexed so that common sections of the subway routing system may be used at different times to transmit data between different resources of FPGA 200, thereby maximizing bandwidth of the subway routing system.

Although only four subway ports 230 are shown in FIG. 2 for simplicity, actual embodiments of FPGA 200 may include any number of subway ports 230. Further, the particular arrangement of subway ports 230 depicted in FIG. 2 is exemplary. For actual embodiments, subway ports 230 may be provided in any suitable arrangement across FPGA 200. Thus, for some embodiments, subway ports 230 may be arranged in a fixed pattern across FPGA 200, for example, as depicted in the exemplary embodiment of FIG. 2. For other embodiments, subway ports 230 may be provided in a non-regular arrangement so that subway ports 230 are provided near the FPGA resources that are most likely to utilize the subway routing system (e.g., near resources associated with low performance signals). For example, referring also to FIG. 1, for actual embodiments, subway ports 230 may be provided near IOBs 110 and embedded processor cores 150 because of relatively large latencies typically associated with IOBs 110 and processor cores 150.

Figure 3:
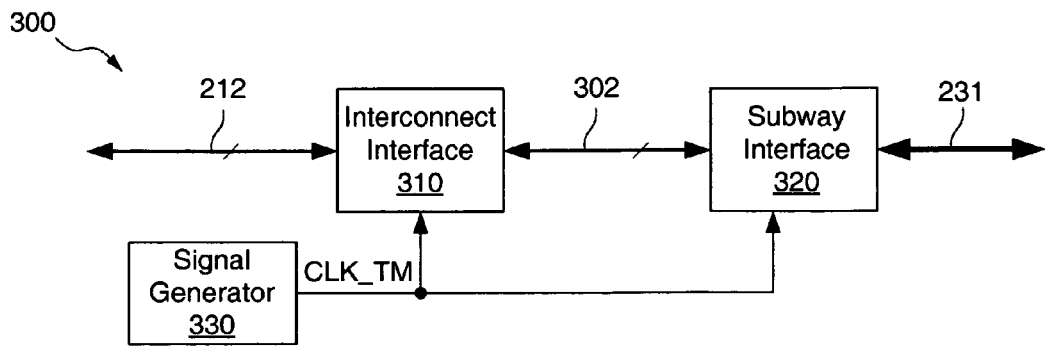
FIG. 3 is a block diagram of a subway port of FIG. 2 in accordance with some embodiments of the present invention.

FIG. 3 shows a subway port 300 that is one embodiment of subway port 230 of FIG. 2. Subway port 300 includes an interconnect interface 310 and a subway interface 320 coupled together via a plurality of signal lines 302. Referring also to FIG. 2, interconnect interface 310 is coupled to a plurality of signal line outputs of an associated switch matrix 232 via a plurality of corresponding signal lines 212, and for some embodiments includes a control terminal to receive a time-multiplexed clock signal CLK_TM provided by a signal generator 330. Subway interface 320 is coupled to subway bus 231, and includes a control terminal to receive CLK_TM. As described in more detail below, interconnect interface 310 controls the transfer of data between subway port 300 and the programmable interconnect via its associated switch matrix 232, and subway interface 320 controls the transfer of data between subway port 300 and subway bus 231.

For some embodiments, interconnect interface 310 provides a signal path between corresponding pairs of signal lines 212 and 302, for example, so that data provided from a signal line output of associated switch matrix 232 via a corresponding signal line 212 is routed through interconnect interface 310 onto a corresponding signal line 302. Further, subway interface 320 may be configured to identify which signals provided on the subway bus 231 are to be captured by subway port 300 and routed to a designated signal line of the programmable interconnect via a corresponding signal path provided by the associated switch matrix 232, signal line 212, and interconnect interface 310.

Signal generator 330 may be any suitable signal generator. For some embodiments, signal generator 330 may generate CLK_TM in response to an FPGA system clock (not shown for simplicity). For one embodiment, signal generator 330 may use the system clock as CLK_TM. For another embodiment, signal generator 330 may generate CLK_TM to have a frequency that is some fraction or multiple of the frequency of the system clock. As explained below, CLK_TM may be used to control the transfer of data between different configurable resources (e.g., such as CLBs 104) of FPGA 200 over the shared subway bus 231 using suitable time-multiplexing techniques. In this manner, a plurality of signals may share the common routing resources of the subway routing system to maximize the signal routing capability of the subway routing system, which in turn may minimize routing demands upon the programmable interconnect. Further, the selection of which signals associated with a user design are to be routed over the subway bus 231 and the subsequent placement of these signals on the subway routing system may be performed in a manner that is transparent to the end user.

As mentioned above, for some embodiments, the subway routing system may be utilized for routing low performance signals, and the programmable interconnect may be utilized for routing high performance signals. More specifically, for some embodiments, a user design may be analyzed to identify a number of low performance signals that may be routed over the subway routing system, thereby bypassing corresponding portions of the programmable interconnect.

Figure 8:
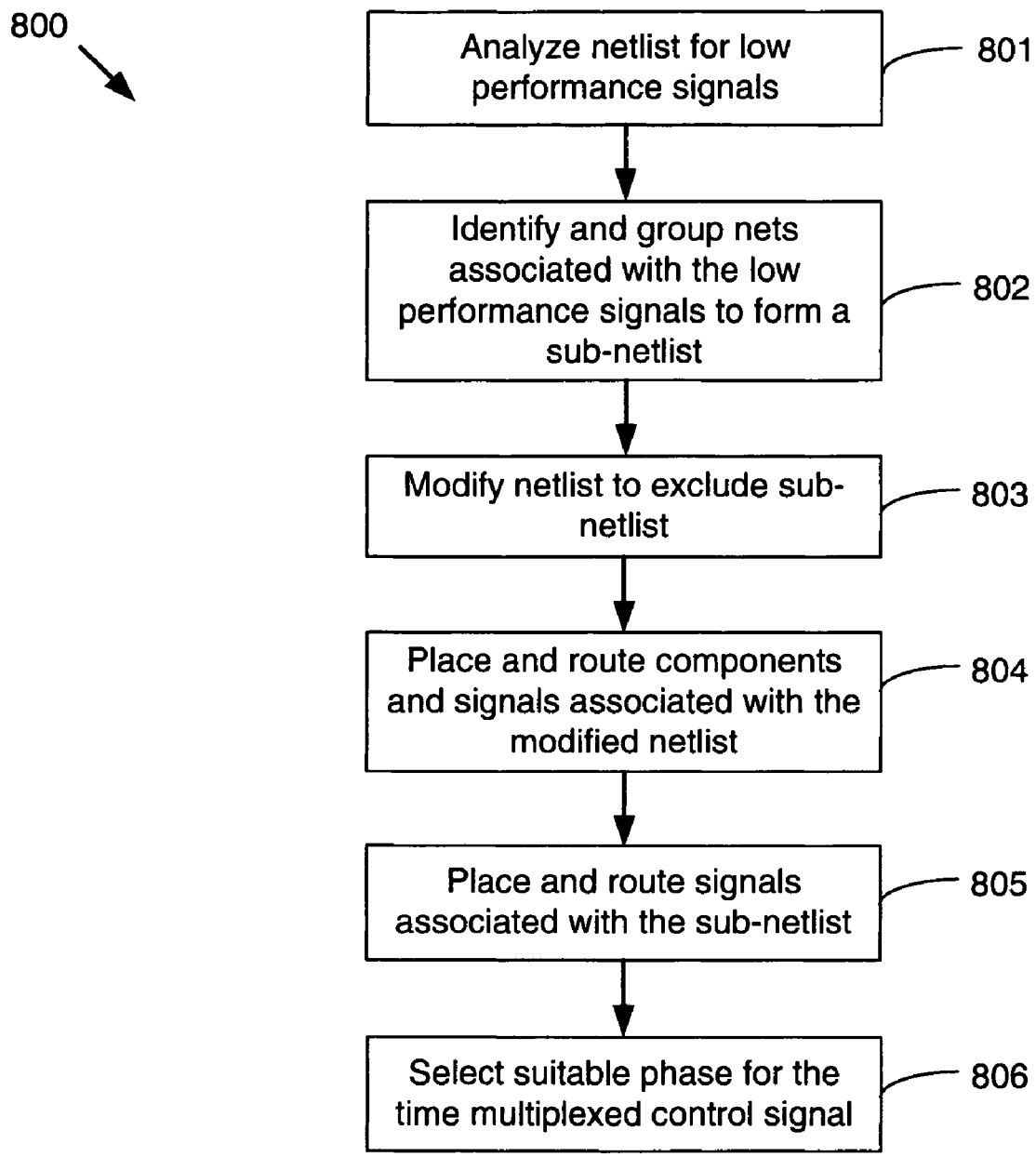
FIG. 8 is a flow chart illustrating an exemplary operation for configuring one embodiment of the subway routing system of FIG. 2.

For example, FIG. 8 is a flow chart illustrating one embodiment for time multiplexing selected low performance signals associated with a user design on the subway routing system of FPGA 200. First, a netlist embodying a user design is analyzed for low performance signals, which may comprise complete nets or subnets of the connections (e.g., destinations) of nets (step 801). For some embodiments, the performance of the user design may be estimated using well-known static timing analysis to identify the low performance signals as signals that are not time critical, for example, by identifying those signals that have the greatest amount of timing slack. Next, the nets associated with the low performance signals are identified and grouped together to form a sub-netlist (step 802). For some embodiments, routing performance of the low performance signals embodied by the sub-netlist over the subway routing system may be estimated using suitable simulation tools. Then, the original netlist is modified to exclude the sub-netlist associated with the identified low performance signals (step 803).

The modified netlist is then placed and routed using conventional techniques (step 804). For example, as known in the art, the structural components of the user design may be mapped to various configurable resources (e.g., such as CLB tiles 210) of the FPGA, and the signals associated with the modified netlist may be routed using the FPGA's programmable interconnect. Then, the signals associated with the sub-netlist may be placed and routed upon the subway routing system (step 805). Thus, for each net omitted from the original netlist, a signal may be routed from the net's source to a first subway port, from the first subway port to a second subway port over the subway bus, and then from the second subway port to the destination. The subway port may be selected in a manner that simplifies signal routing and/or that eases routing congestion. When feasible, nets omitted from original netlist may be routed over the programmable interconnect, thereby avoiding the subway routing system.

Finally, a suitable phase of the time multiplexed clock signal CLK_TM is selected to control the transmission of signals across the shared subway bus 231 (step 806). For some embodiments, CLK_TM may be properly timed to ensure that propagation delays of signals routed over the subway routing system are matched to their intended destinations. For example, for some embodiments, CLK_TM may be varied as needed so that each signal is received at its destination at the appropriate time. For other embodiments, the maximum speed of CLK_TM may be timed based on the slowest signal that is to be routed over the subway routing system. Further, if time critical signals are not routed on the subway routing system, then CLK_TM need not run faster than the system clock, thereby easing performance constraints on the FPGA. Conversely, if time critical signals are routed on the subway routing system, then CLK_TM may run faster than the system clock. Further, for some embodiments, the process flow depicted in FIG. 8 may also include a scheduling step that assigns a time slot for each signal.

For other embodiments, the process flow described above with respect to FIG. 8 may be modified to ensure that the subway routing system is used in a manner that maximizes the signal routing efficiencies of the programmable interconnect and the subway routing system. For example, processing step 804 of FIG. 8 may be modified so that the CLBs 104 are placed first, and then before the signals are routed, signals associated with low performance logic and/or signals that are routed long distances across the FPGA device (e.g., where the signal source and the signal destination are not close to each other) are identified, included in the sub-netlist, and then removed from the routing operation in step 804. By removing low performance and/or long-distance signals from the modified netlist, these signals are more likely to be routed over the subway routing system. Alternatively, the long-distance signals may result from the placement operation in step 804.

Referring again to FIG. 2, the exemplary subway routing system of FPGA 200 may be used to route data from a source CLB 104X to a destination CLB 104Y as follows. First, the data is routed from CLB 104X to a designated signal line path of switch matrix 211X via a corresponding one of signal lines 212X, and switch matrix 211X routes the data to a designated one of signal lines 222A of the programmable interconnect via PIP 213X in a well-known manner. The data provided on the designated signal line 222A is routed to a corresponding signal line path of subway port 230B (e.g., the source subway port) via PIP 213B and a designated signal path in switch matrix 232B. Then, in accordance with an embodiment of the present invention, subway port 230B receives the data from associated switch matrix 232B via a corresponding one of signal lines 233B and, under control of CTRL_TM, outputs the data onto subway bus 231. Once provided onto subway bus 231, the data is captured by subway port 230D (e.g., the destination subway port), which for some embodiments may also be under the control of CTRL_TM. Subway port 230D forwards the data to a designated signal line path of switch matrix 232D, which in turn routes the data onto a designated one of signal lines 222A via PIP 213D. The data is then routed on the designated signal line 222A to PIP 213Y, which in turn routes the data to a designated input of destination CLB 104Y via a corresponding signal path of switch matrix 211Y.

Accordingly, by using the subway routing system to route signals from CLB 104X to CLB 104Y, portions of the programmable interconnect signal line 222A residing between PIP 213B and PIP 213D are bypassed, and therefore may be utilized for routing other (e.g., high performance) signals between various resources of the FPGA. In this manner, the subway routing system may supplement the signal routing capability of the programmable interconnect, for example, to allow the programmable interconnect to route more of the high performance signals associated with the user design.

As mentioned above, data may be routed between different portions of the FPGA over the subway routing system at different times. For some embodiments, each data to be routed over the subway bus may be assigned a corresponding one of a plurality of time slots, which may defined using CLK_TM. For such embodiments, the subway ports associated with each data may enabled during the corresponding time slot, and the subway ports not associated with the data may be disabled during the corresponding time slot so that different sets of data may be routed over the shared subway bus without using destination addresses.

Figure 4:
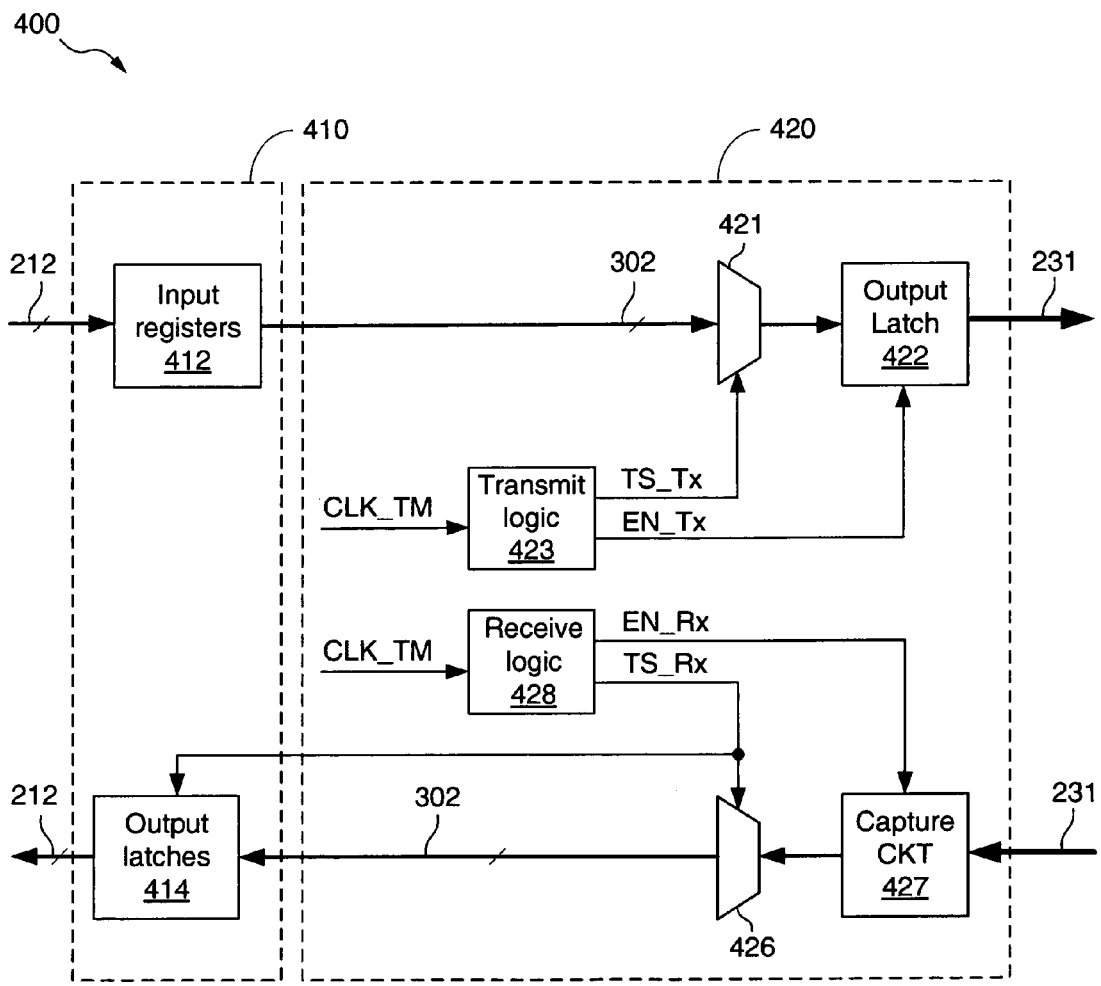
FIG. 4 is a block diagram of one embodiment of the subway port of FIG. 3.

FIG. 4 shows an exemplary subway port 400 that is one embodiment of subway port 300 of FIG. 3. Subway port 400, which may be used to route data over the subway bus 231 without transmitting destination addresses over subway bus 231, is shown to include an interconnect interface 410 and a subway interface 420. Interconnect interface 410, which is one embodiment of interconnect interface 310 of FIG. 3, includes a plurality of input registers 412 and a plurality of output latches 414, and is configured to communicate with the associated switch matrix 232 via signal lines 212. Subway interface 420, which is one embodiment of subway interface 320 of FIG. 3, includes a transmit multiplexer (MUX) 421, an output latch 422, transmit logic 423, a receive de-multiplexer (DMUX) 426, a capture circuit 427, and receive logic 428, and is configured to communicate with subway bus 231.

Each input register 412 includes an input coupled to a designated signal path (not shown for simplicity) of the associated switch matrix 232 via a corresponding signal line 212, and includes an output coupled to a corresponding input of transmit MUX 421 via a corresponding signal line 302. For other embodiments, input registers 412 may be omitted. Transmit MUX 421 includes an output coupled to an input of output latch 422, which includes an output coupled to subway bus 231. Transmit logic 423 includes an input to receive CLK_TM, and in response thereto generates a transmit time slot signal TS_Tx and a transmit enable signal EN_Tx. The TS_Tx signal is provided to the control terminal of transmit MUX 421, and the EN_Tx signal is provided to an output enable input of output latch 422.

Capture circuit 427 includes an input coupled to subway bus 231 and an output coupled to an input of DMUX 426. Each output latch 414 includes an input coupled to an output of DMUX 426 via a corresponding signal line 302, and includes an output coupled to a designated signal path of the associated switch matrix 232 via a corresponding signal line 212. Receive logic 428 includes an input to receive CLK_TM, and in response thereto generates a receive time slot signal TS_Rx and a receive enable signal EN_Rx. The TS_Rx signal is provided to the control terminal of receive DMUX 426 and to the clock inputs of output latches 414, and the EN_Rx signal is provided to an enable input of capture circuit 427.

For the exemplary embodiment of FIG. 4, each signal that is to be routed across the subway 231 using subway port 400 is assigned a corresponding time slot, which as mentioned above may be defined using CLK_TM. For some embodiments, a global synchronization signal (not shown for simplicity) may be used to synchronize the phases of CLK_TM across the chip, for example, to minimize clock skew. The time slots assigned to various signals to be output from subway port 400 onto subway bus 231 may be stored in suitable memory elements within transmit logic 423, and the time slots assigned to various signals to be received from subway bus 231 into subway port 400 may be stored in suitable memory elements within receive logic 428. For simplicity, the memory elements within transmit logic 423 and receive logic 428 are not shown in FIG. 4. These time slots may be assigned to various signals during formation of the sub-netlist that includes the low performance signals identified in the user design, and may be programmed into transmit logic 423 and receive logic 428 during configuration of FPGA 200. Then, for each time slot, transmit logic 423 determines whether subway port 400 transmits signals received from the associated switch matrix 232 onto subway bus 231, and receive logic 428 determines whether subway port 400 captures signals on subway bus 231 and routes them to a designated signal line path of the associated switch matrix 232 via interconnect interface 310.

Figure 5A:
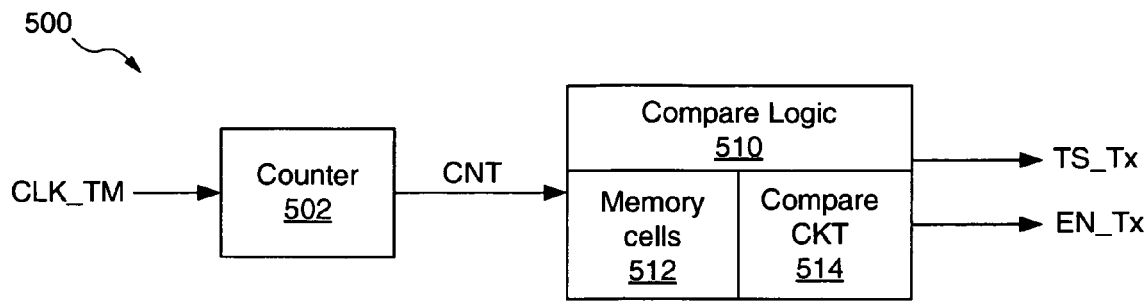
FIG. 5A is a block diagram of one embodiment of the interconnect interface of the subway port of FIG. 4.

For example, FIG. 5A shows transmit logic 500 that is one embodiment of transmit logic 423 of FIG. 4. Transmit logic 500 includes a counter 502 and compare logic 510. Counter 502, which may be a well-known binary counter, includes an input to receive CLK_TM, and in response thereto generates a counter value CNT indicative of the current time slot. Compare logic 510 includes a plurality of memory cells 512 and a plurality of compare circuits 514. Each memory cell 512 stores a time slot assigned to a signal selected for routing from a corresponding signal path of associated switch matrix 232 to subway bus 231 via subway port 400. Each compare circuit 514 compares CNT with the time slot stored in a corresponding memory cell 512. If there is a match, compare logic 510 outputs the memory cell index of the matching entry as TS_Tx and asserts EN_Tx (e.g., to logic high). The TS_Tx signal provided by compare logic 510 causes MUX 421 to forward data received from a corresponding signal path of switch matrix 232 to output latch 422, and the asserted state of EN_Tx causes output latch 422 to transmit the selected data onto subway bus 231. Conversely, if there is not a match, compare logic 510 de-asserts EN_Tx (e.g., to logic low) to prevent output latch 422 from transmitting data onto subway bus 231.

Figure 5B:
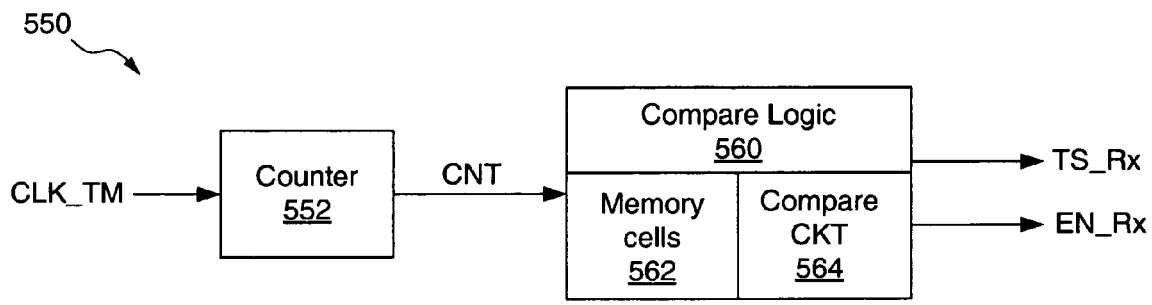
FIG. 5B is a block diagram of one embodiment of the subway interface of the subway port of FIG. 4.

FIG. 5B shows receive logic 550 that is one embodiment of receive logic 428 of FIG. 4. Receive logic 550 includes a counter 552 and compare logic 560. Counter 552, which may be a well-known binary counter, includes an input to receive CLK_TM, and in response thereto generates a value of CNT indicative of the current time slot. Compare logic 560 includes a plurality of memory cells 562 and a plurality of compare circuits 564. Each memory cell 562 stores an assigned time slot for a corresponding signal selected to be captured from subway bus 231 into subway port 400. Each compare circuit 564 compares CNT with the time slot stored in a corresponding memory cell 562. If there is a match, compare logic 560 outputs the memory cell index of the matching entry as TS_Rx and asserts EN_Rx (e.g., to logic high). In response to the asserted state of EN_Rx, capture circuit 427 captures data from subway bus 231 and forwards it to the input of DMUX 426. The TS_Rx signal provided by compare logic 560 causes DMUX 426 to forward the data to a corresponding output latch 414, which in turn routes the data to a designated signal path of the associated switch matrix 232 via a corresponding signal line 212. Thereafter, the associated switch matrix 232 routes the data to its destination (e.g., to CLB 104Y) via a designated signal path of the programmable interconnect. Conversely, if there is not a match, compare logic 560 de-asserts EN_Rx (e.g., to logic low) to prevent capture circuit 427 from capturing data from subway bus 231.

The specific implementations of transmit logic 423 and receive logic 428 described above with respect to FIGS. 5A and 5B, respectively, are merely exemplary, and thus the scope of the present invention is not to be limited to the particular embodiments shown in FIGS. 5A and 5B. Accordingly, for actual embodiments, other circuitry may be used to implement transmit logic 423 and receive logic 428, as will be apparent to those skilled in the art after reading this disclosure. For example, for some embodiments, content addressable memories may be used to implement the functions performed by compare logic 510 and compare logic 560.

For the embodiments described above with respect to FIGS. 4 and 5A-5B, proper operation of the subway routing system depends upon a precise synchronization of the subway ports 232. Thus, performance of such embodiments may be susceptible to clock skew and/or noise associated with CLK_TM. Accordingly, other embodiments of the present invention may be configured to transmit data between different portions of the FPGA over the shared subway bus 231 at different times using destination addresses, thereby avoiding potential performance degradation or failure resulting from imprecise time slot synchronization between the various subway ports 230 of the subway routing system.

Figure 6:
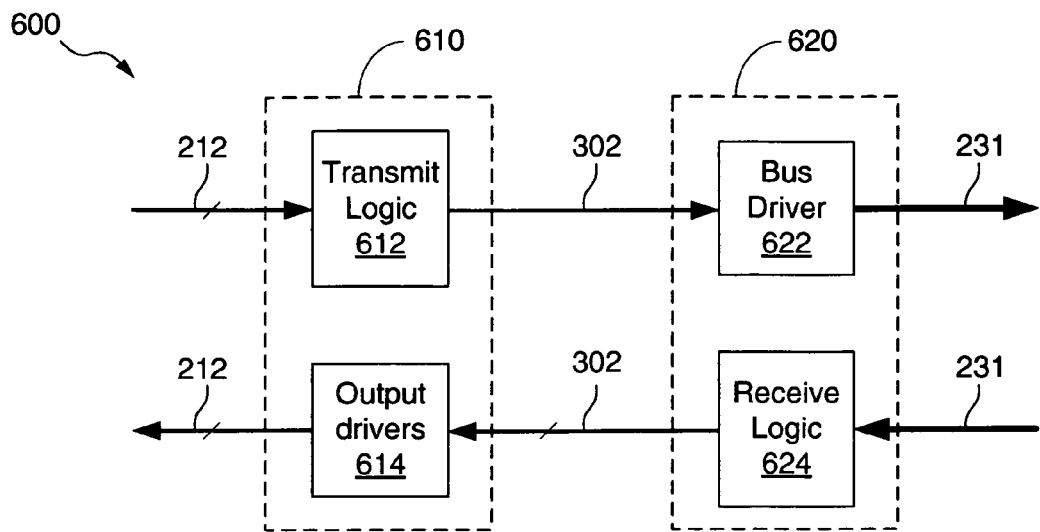
FIG. 6 is a block diagram of another embodiment of the subway port of FIG. 3.

FIG. 6 shows a subway port 600 that is another embodiment of subway port 300 of FIG. 3. Subway port 600, which is configured to route data over the subway bus 231 using destination addresses, is shown to include an interconnect interface 610 and a subway interface 620. Interconnect interface 610, which is another embodiment of interconnect interface 310 of FIG. 3, includes transmit logic 612 and a plurality of output drivers 614. Subway interface 620, which is another embodiment of subway interface 320 of FIG. 3, includes a bus driver 622 and receive logic 624. Transmit logic 612 includes inputs coupled to designated signal paths of the associated switch matrix 232 via corresponding signal lines 212, and includes an output coupled to an input of bus driver 622 via signal line 302. Bus driver 622 includes an output coupled to subway bus 231. Receive logic 624 includes an input coupled to subway bus 231, and includes a plurality of outputs coupled to inputs of corresponding output drivers 614 via signal lines 302. Each output driver includes an output coupled to a designated signal path of associated switch matrix 232 via a corresponding signal line 212.

For the exemplary embodiment of FIG. 6, transmit logic 612 stores destination addresses for signals that are received from designated signal paths of associated switch matrix 232 via corresponding signal lines 212 and that are selected for routing over the subway bus 231 via subway port 600. Receive logic 624 stores the destination addresses of signals routed on subway bus 231 that are to be captured by subway port 600 and that are to be routed to designated signal lines of the programmable interconnect via corresponding signal paths of the associated switch matrix 232. The destination addresses, which form part of the sub-netlist embodying the low performance signals identified in the user design, may be programmed into associated memory elements within transmit logic 612 and receive logic 624 during configuration of FPGA 200. Further, although not shown in FIG. 6 for simplicity, transmit logic 612 and receive logic 624 may be clocked using CLKK_TM, for example, according to time slots assigned to various signals selected for routing over subway bus 231.

An exemplary operation of subway port 600 is as follows. Each signal to be routed onto subway bus 231 from the programmable interconnect arrives at a designated input of transmit logic 612 via a corresponding signal line 212. Transmit logic 612 attaches a corresponding destination address to the signal, which is then driven onto subway bus 231 via bus driver 622. Thus, for each signal routed on subway bus 231, receive logic 624 compares its destination address with the destination addresses stored therein. If there is a match, receive logic 624 forwards the signal to a designated output driver 614 via a corresponding signal line 302. In response thereto, the output driver 614 routes the signal to a designated signal path of associated switch matrix 232 via a corresponding signal line 212. Thereafter, the associated switch matrix 232 may route the signal onto a designated signal line of the programmable interconnect for routing to the appropriate destination resource of the FPGA.

Figure 7A:
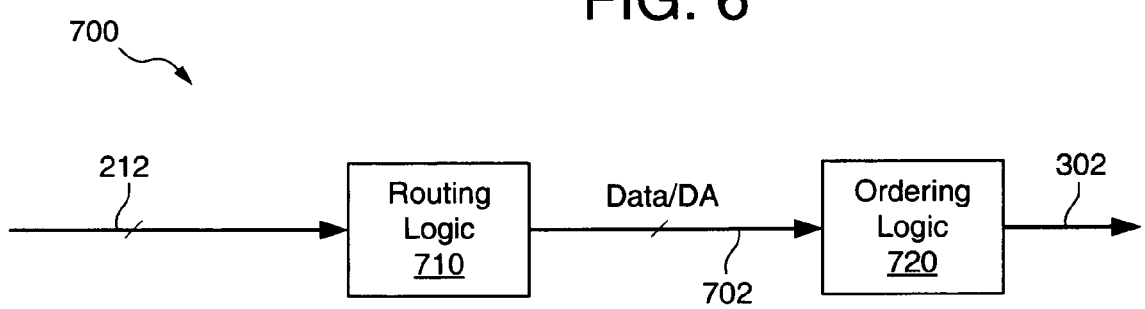
FIG. 7A is a block diagram of one embodiment of the interconnect interface of the subway port of FIG. 6.

FIG. 7A shows transmit logic 700 that is one embodiment of transmit logic 612 of FIG. 6. Transmit logic 700 includes routing logic 710 and ordering logic 720. Routing logic 710 includes a plurality of registers (not shown for simplicity) that store destination addresses for corresponding signals to be routed onto subway bus 231. For some embodiments, the registers within routing logic 710 may also store time slot information for corresponding signals. Routing logic 710 provides signal paths between signal paths of the associated switch matrix 232 via signal lines 212 and corresponding input of ordering logic 720 via signal lines 702. Ordering logic 720, which includes an output coupled to bus driver 622 via signal line 302, determines the order in which signals received from designated signal paths of the associated switch matrix 232 via routing logic 710 are output to subway bus 231. Ordering logic 720 may use any suitable bus ordering and/or bus arbitration techniques. For example, for some embodiments, ordering logic 720 may utilize well-known round-robin or token ring techniques using CLK_TM to sequentially drive various signals onto subway bus 231. For other embodiments, ordering logic 720 may be configured to use a source-synchronous clock signal. For other embodiments, ordering logic 720 may be configured to use asynchronous signaling techniques (e.g., such as handshaking). For yet other embodiments, ordering logic 720 may use well-known Ethernet transmission protocols and/or well-known Internet transmission protocols.

Figure 7B:
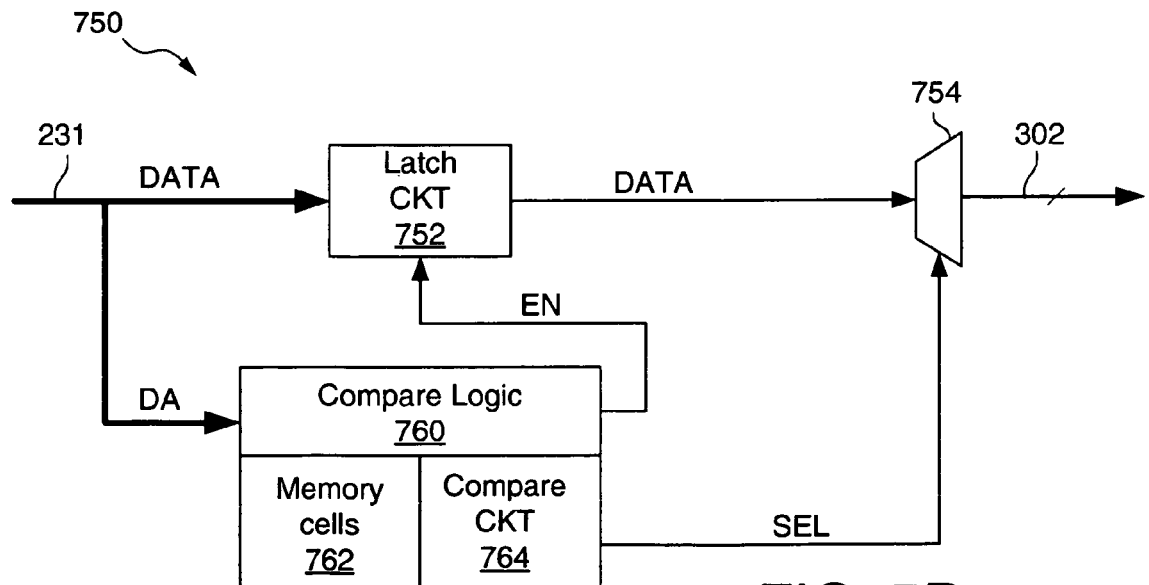
FIG. 7B is a block diagram of one embodiment of the subway interface of the subway port of FIG. 6.

FIG. 7B shows receive logic 750 that is one embodiment of receive logic 624 of FIG. 6. Receive logic 750 includes a latch circuit 752, a DMUX 754, and compare logic 760. Latch circuit 752, which may include any number of suitable latches responsive to a clock or other enabling signal, includes an input to receive the data from subway bus 231, and includes an output coupled to an input of DMUX 754, which includes a plurality of outputs coupled to designated signal paths of the associated switch matrix 232 via corresponding signal lines 302 and output drivers 614. Compare logic 760 includes a plurality of memory cells 762 and a plurality of compare circuits 764. Each memory cell 762 stores the destination address for corresponding data designated for capture from subway bus 231 into subway port 600. Each compare circuit 764 compares the destination address of data received from subway bus 231 with the destination addresses stored in memory cells 762 to determine whether the data received from subway bus 231 is designated for processing by subway port 600. If there is not a match, compare logic 760 de-asserts the enable signal EN (e.g., to logic low), which prevents latch circuit 752 from latching the data from subway bus 231.

Conversely, if there is a match, compare logic 760 asserts EN (e.g., to logic high), and outputs the memory cell index of the matching entry as a select signal SEL to the control terminal of DMUX 754. The asserted state of EN causes latch circuit 752 to latch the data from subway bus 231 and forward the data to DMUX 754. In response to SEL, DMUX 754 routes the data on a selected one of signal lines 302 to a corresponding output driver 614, which in turn routes the data onto a designated signal line of the programmable interconnect via a corresponding signal path in the associated switch matrix 232.

The specific implementation of receive logic 624 described above with respect to FIG. 7B is merely exemplary, and thus the scope of the present invention is not to be limited to the particular embodiment shown in FIG. 7B. Accordingly, for actual embodiments, other circuitry may be used to implement receive logic 624, as will be apparent to those skilled in the art after reading this disclosure. For example, for some embodiments, a content addressable memory may be used to implement the functions performed by compare logic 760.

For other embodiments, the subway bus 231 may be replaced by multi-bit signal line connections that pass through the various subway ports 230 of the subway routing system. For such embodiments, each subway port 230 may include a plurality of store-and-forward circuits that clock data provided on the subway signal lines, and then either forwards the data to an adjacent subway port via the subway signal lines or routes the data to a destination resource using the associated switch matrix 232 and the programmable interconnect. For such embodiments, there is a clock delay associated with each subway port. However, the subway clock delays are relatively short compared with the latency of the low performance signals selected for routing across the subway routing system.

Figure 9:
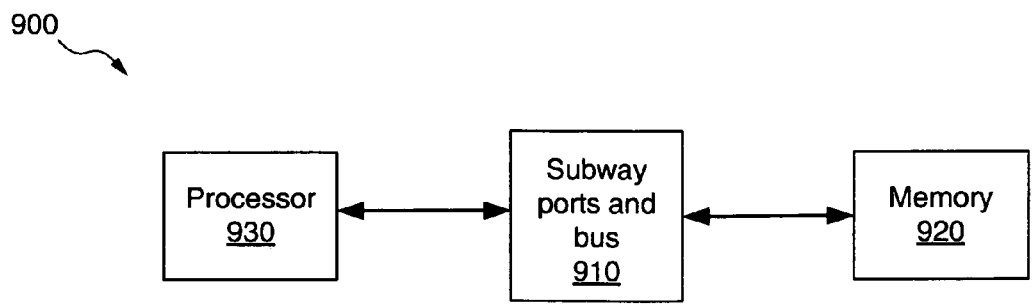
FIG. 9 is a block diagram of a subway routing system in accordance with another embodiment of the present invention.

For other embodiments, the subway routing system may also include a memory device and a processor that may be programmed to implement selected portions of the user design, for example, such as some of the relatively low-performance logic of the user design. For example, FIG. 9 shows a subway routing system 900 in accordance with another embodiment of the present invention. Subway routing system 900 includes a subway architecture 910 that is coupled to a memory 920 and to a processor 930. Subway architecture 910 is representative of the subway bus 231 and corresponding subway ports 230 described above with respect to FIG. 2. Memory 920, which may be any suitable memory device, may be used to buffer data to be routed over the subway bus 231. In this manner, some signals may be routed to and from memory 920 rather than from a source tile to a destination tile over the subway bus 231. For these signals, the associated subway ports 230 may be connected to processor 930 rather than to switch matrices 211.

Processor 930 may be any suitable processor. For some embodiments, processor 930 may be one of the embedded FPGA processors 150 or a soft processor core such as MicroBlaze™ from Xilinx, Inc. of San Jose, Calif., while for other embodiments processor 930 may be a separate dedicated processor. Processor 930, which may be used to control read and write operations to memory 920, may execute code similar to that of a complied code simulator, thereby potentially implementing a large amount of logic that is normally implemented by various configurable resources of the FPGA. Because the logic simulated by processor 930 typically operates more slowly than the logic implemented by the FPGA's configurable resources, signals associated with the simulated logic are well-suited for routing over the subway routing system. For some embodiments, signals associated with logic simulated by processor 930 may be retrieved from memory 920, processed by processor 930, and then written back to memory 930. In this manner, some signals associated with logic simulated by processor 930 need not be routing over the subway bus, thereby easing congestion on the subway bus.

Figure 10:
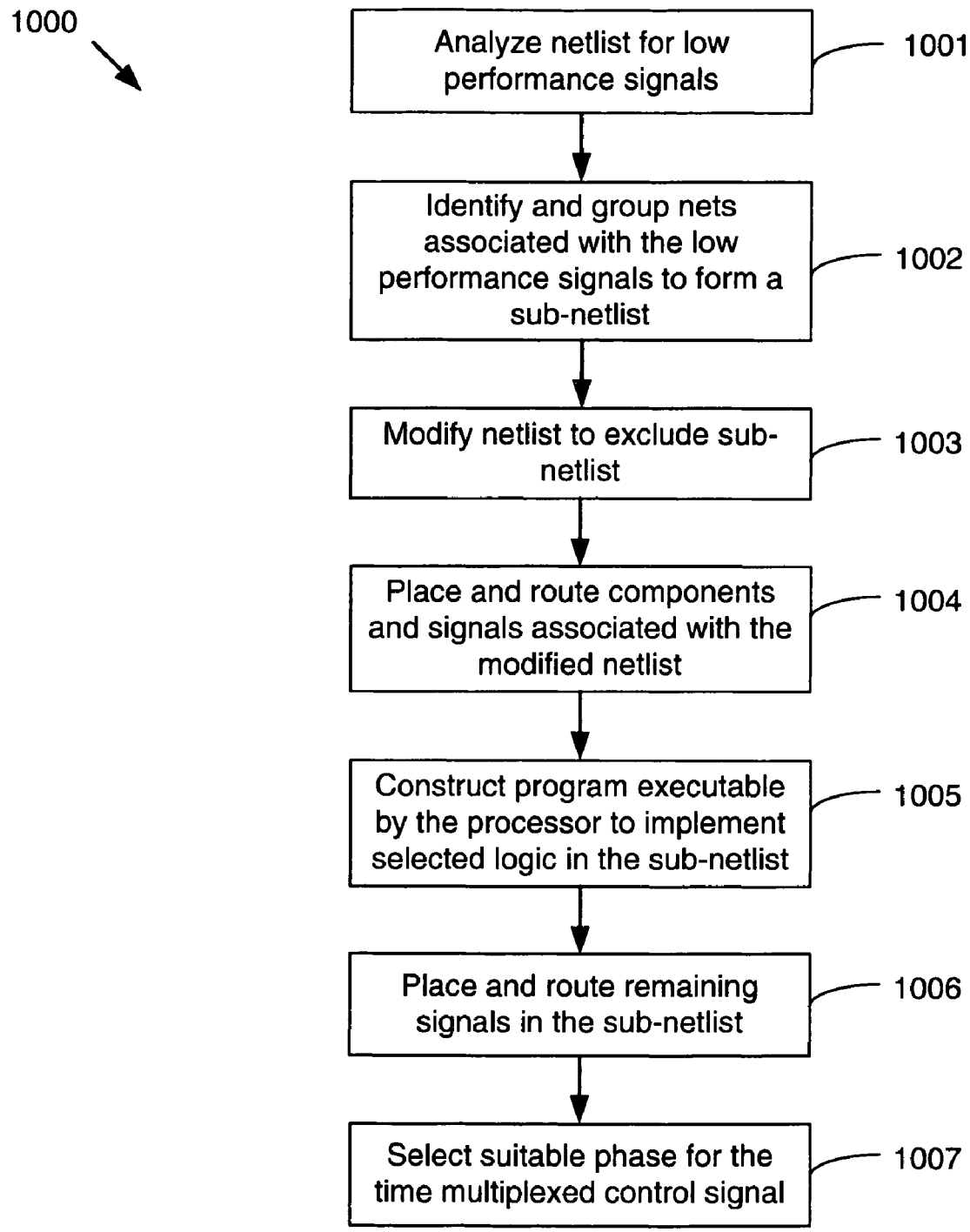
FIG. 10 is a flow chart illustrating an exemplary operation of the subway routing system of FIG. 9.

For example, FIG. 10 is a flow chart illustrating an exemplary operation of subway routing system 900. A netlist embodying a user design is analyzed for low performance signals (step 1001), the nets associated with the low performance signals are identified and grouped together to form a sub-netlist (step 1002), the original netlist is modified to exclude the sub-netlist associated with the identified low performance signals (step 1003), and then the modified netlist is placed and routed using conventional techniques (step 1004), for example, in the manner described above with respect to steps 801-804, respectively, of FIG. 8.

Next, a program is constructed and loaded into processor 930 to implement selected logic in the sub-netlist (step 1005). The program may be constructed using well-known compiled-code simulation techniques. Then, the signals remaining in the sub-netlist may be placed and routed upon the subway routing system (step 1006), and a suitable phase of CLK_TM is selected to control the transmission of signals across the shared subway bus 231 (step 1007), for example, in the manner described above with respect to steps 805-806, respectively, of FIG. 8.

While particular embodiments of the present invention have been shown and described, it will be obvious to those skilled in the art that changes and modifications may be made without departing from this invention in its broader aspects, for example, in an alternative embodiment high performance signals are routed via the subway routing system, and therefore, the appended claims are to encompass within their scope all such changes and modifications as fall within the true spirit and scope of this invention.

What is claimed is:

1. A programmable logic device (PLD), comprising:
   a plurality of configurable resources;
   a programmable interconnect including a plurality of signal lines for providing a number of dedicated signal paths between any of the configurable resources;
   a subway routing system including a shared subway bus coupled to the signal lines of the programmable interconnect at a plurality of connection points by a plurality of corresponding subway ports; and
   a signal generator coupled to the subway ports and configured to generate a time multiplexed clock signal that defines a plurality of time slots, wherein during each time slot the subway bus routes only data assigned to the corresponding time slot.

2. The PLD of claim 1, wherein data routed on the subway routing system bypasses corresponding portions of the signal lines of the programmable interconnect.

3. The PLD of claim 1, wherein the subway bus is configured to route data between different sets of subway ports at different times.

4. The PLD of claim 1, further comprising:
   a plurality of first switch matrices, each coupled between a corresponding configurable resource and one or more signals lines of the programmable interconnect; and
   a plurality of second switch matrices, each coupled between a corresponding subway port and one or more signal lines of the programmable interconnect.

5. The PLD of claim 1, wherein the subway port further comprises:
   a multiplexer circuit having a plurality of inputs to receive data from designated signal lines of the programmable interconnect, an output coupled to the subway bus, and a control terminal responsive to the time multiplexed clock signal; and
   a de-multiplexer circuit having an input to receive data from the subway bus, a plurality of outputs coupled to designated signal lines of the programmable interconnect, and a control terminal responsive to the time multiplexed clock signal.

6. The PLD of claim 5, wherein the subway port further comprises:
an output latch coupled between the output of the multiplexer circuit and the subway bus, and having a clock input; and
transmit logic having an input to receive the time multiplexed clock signal, a first output to generate a transmit time slot signal provided to the control terminal of the multiplexer circuit, and a second output to generate a transmit enable signal provided to the clock input of the output latch.

7. The PLD of claim 6, wherein the transmit logic determines whether data received from the programmable interconnect is associated with a current transmit time slot, and in response thereto selectively asserts the transmit enable signal and generates a corresponding value for the transmit time slot signal.

8. The PLD of claim 7, wherein the transmit logic further comprises:
a counter having an input to receive the time multiplexed clock signal and having an output to generate a counter value indicative of the current time slot; and
means for comparing the counter value with one or more assigned time slots to generate the transmit enable signal and the transmit time slot signal, wherein each assigned time slot corresponds to data selected for processing by the subway port.

9. The PLD of claim 5, wherein the subway port further comprises:
a capture circuit coupled between the subway bus and the input of the de-multiplexer circuit, and having a control terminal; and
receive logic having an input to receive the time multiplexed clock signal, a first output to generate a receive time slot signal provided to the control terminal of the de-multiplexer circuit, and a second output to generate a receive enable signal provided to the control terminal of the capture circuit.

10. The PLD of claim 9, wherein the receive logic determines whether data received from the subway bus is associated with a current transmit time slot, and in response thereto selectively asserts the receive enable signal and generates a corresponding value for the receive time slot signal.

11. The PLD of claim 10, wherein the receive logic further comprises:
a counter having an input to receive the time multiplexed clock signal and having an output to generate a counter value indicative of the current time slot; and
means for comparing the counter value with one or more assigned time slots to generate the receive enable signal and the receive time slot signal, wherein each assigned time slot corresponds to data selected for processing by the subway port.

12. The PLD of claim 1, wherein data is routed over the subway bus using destination addresses.

13. The PLD of claim 12, wherein the subway port further comprises:
transmit logic having a plurality of inputs to receive data from corresponding signal paths of the programmable interconnect, and having an output coupled to the subway bus, wherein for data received from each of the signal paths of the programmable interconnect, the transmit logic is configured to transmit the data and a corresponding destination address onto the subway bus; and
receive logic having an input to receive data from the subway bus, and having a plurality of outputs coupled to corresponding signal paths of the programmable interconnect, wherein for data received from the subway bus, the receive logic is configured to route the data onto a designated signal path of the programmable interconnect in response to the destination address associated with the data.

14. The PLD of claim 13, wherein the transmit logic further comprises:
routing logic including a plurality of registers for storing destination addresses for data received from the designated signal paths of the programmable interconnect; and
ordering logic having inputs to receive data and destination addresses from the routing logic, and having an output to sequentially transmit corresponding pairs of data and destination addresses onto the subway bus using a predetermined scheduling technique.

15. The PLD of claim 13, wherein the receive logic further comprises:
a latch circuit having an input to receive data from the subway bus, a control terminal to receive an enable signal, and an output;
a de-multiplexer circuit having an input coupled to the output of the latch circuit, an output to provide data to the programmable interconnect, and a control terminal to receive a select signal; and
means for comparing the data's destination address with one or more predetermined destination address to generate the enable signal and the select signal, wherein each predetermined destination address corresponds to data selected for processing by the subway port.

16. The PLD of claim 1, wherein the subway routing system further comprises:
a processor coupled to the subway bus; and
a memory device coupled to the subway bus and accessible by the processor, wherein the memory device is configured to store data selected for routing over the subway bus, and the processor is configured to implement selected portions of a user design to be implemented by the PLD.

17. A programmable logic device (PLD), comprising:
a plurality of configurable resources;
a programmable interconnect including a plurality of signal lines for providing a number of dedicated signal paths between any of the configurable resources; and
a subway routing system including a shared subway bus coupled to the signal lines of the programmable interconnect at a plurality of connection points by a plurality of corresponding subway ports;
wherein data is routed over the subway bus using destination addresses; and
wherein the subway port further comprises:
transmit logic having a plurality of inputs to receive data from corresponding signal paths of the programmable interconnect, and having an output coupled to the subway bus, wherein for data received from each of the signal paths of the programmable interconnect, the transmit logic is configured to transmit the data and a corresponding destination address onto the subway bus; and
receive logic having an input to receive data from the subway bus, and having a plurality of outputs coupled to corresponding signal paths of the programmable interconnect, wherein for data received from the subway bus, the receive logic is configured to route the data onto a designated signal path of the programmable interconnect in response to the destination address associated with the data.

18. The PLD of claim 17, wherein the transmit logic further comprises:
routing logic including a plurality of registers for storing destination addresses for data received from the designated signal paths of the programmable interconnect; and
ordering logic having inputs to receive data and destination addresses from the routing logic, and having an output to sequentially transmit corresponding pairs of data and destination addresses onto the subway bus using a predetermined scheduling technique.

19. The PLD of claim 17, wherein the receive logic further comprises:
a latch circuit having an input to receive data from the subway bus, a control terminal to receive an enable signal, and an output;
a de-multiplexer circuit having an input coupled to the output of the latch circuit, an output to provide data to the programmable interconnect, and a control terminal to receive a select signal; and
means for comparing the data's destination address with one or more predetermined destination address to generate the enable signal and the select signal, wherein each predetermined destination address corresponds to data selected for processing by the subway port.

* * * * *